(12) United States Patent
Kong et al.

(10) Patent No.: US 7,928,792 B2
(45) Date of Patent: Apr. 19, 2011

(54) APPARATUS FOR OUTPUTTING COMPLEMENTARY SIGNALS USING BOOTSTRAPPING TECHNOLOGY

(75) Inventors: Bai-Sun Kong, Suwon-si (KR); Byung-Hwa Jung, Hwaseong-si (KR); Sung-Chan Kang, Busan (KR)

(73) Assignee: Sungkyunkwan University Foundation for Corporate Collaboration

( * ) Notice: Subject to any disclaimer, the term of this patent is extended or adjusted under 35 U.S.C. 154(b) by 50 days.

(21) Appl. No.: 12/367,398

(22) Filed: Feb. 6, 2009

(65) Prior Publication Data

US 2010/0176857 A1    Jul. 15, 2010

(30) Foreign Application Priority Data

Jan. 9, 2009    (KR) .................. 10-2009-0001839

(51) Int. Cl.
*H03L 5/00* (2006.01)
(52) U.S. Cl. ............................ 327/333; 326/80; 326/81
(58) Field of Classification Search .................. 327/333; 326/80, 81
See application file for complete search history.

(56) References Cited

U.S. PATENT DOCUMENTS

| | | | | |
|---|---|---|---|---|
| 4,130,897 A * | 12/1978 | Horne et al. | ................. | 365/205 |
| 4,500,799 A * | 2/1985 | Sud et al. | ...................... | 326/107 |
| 5,128,560 A * | 7/1992 | Chern et al. | .................... | 326/81 |
| 6,754,121 B2 * | 6/2004 | Worley | ......................... | 365/207 |
| 7,154,332 B2 * | 12/2006 | Tsuchi | .......................... | 330/255 |
| 7,605,613 B2 * | 10/2009 | Huang et al. | ................... | 326/115 |
| 2003/0185076 A1 * | 10/2003 | Worley | ........................ | 365/207 |
| 2004/0041613 A1 * | 3/2004 | Chen | ............................. | 327/333 |
| 2005/0012537 A1 * | 1/2005 | Lee | ................................ | 327/333 |
| 2005/0040889 A1 * | 2/2005 | Tsuchi | .......................... | 330/255 |
| 2008/0252372 A1 * | 10/2008 | Williams | ..................... | 330/251 |

OTHER PUBLICATIONS

Jung, et al., Novel bootstrapped CMOS differential logic family for ultra-low voltage SoCs, IEICE Electronics Express, 2008, vol. 5, No. 18, pp. 711-717.
Kuo, James B., Evolution of Low-Voltage CMOS Digital VLSI Circuits Using Bootstrap Technique, IEEE International Meeting for Future of Electron Devices, Jul. 2004, pp. 23-25.

* cited by examiner

*Primary Examiner* — Lincoln Donovan
*Assistant Examiner* — Ryan C Jager
(74) *Attorney, Agent, or Firm* — Knobbe Martens Olson & Bear LLP

(57) ABSTRACT

Disclosed herein is an apparatus for outputting complementary signals using bootstrapping technology. The apparatus for outputting complementary signals includes a precharged logic block, one or more output nodes, and a bootstrapping circuit block. The precharged differential logic block generates a differential signal depending on an input signal. The one or more output nodes output the complementary signals depending on the differential signal. The bootstrapping circuit block is shared by the one or more output nodes, and amplifies the complementary signals.

12 Claims, 3 Drawing Sheets

APPARATUS FOR OUTPUTTING COMPLEMENTARY SIGNALS USING BOOTSTRAPPING TECHNOLOGY

BACKGROUND OF THE INVENTION

1. Field of the Invention

The present invention relates generally to an apparatus for outputting complementary signals using bootstrapping technology, and, more particularly, to an apparatus for outputting complementary signals using bootstrapping technology, which can reduce a related area by improving the structures of a bootstrapping circuit block and the apparatus for outputting complementary signals and which can achieve high performance in low-power applications by increasing switching speed.

2. Description of the Related Art

As a result of the higher performance and diversification of portable electronic devices such as mobile phones, Personal Digital Assistants (PDAs) and Portable Multimedia Players (PMPs), the level of integration and operating frequency of circuits within the portable electronic devices are increasing, thereby resulting in an abruptly increasing power consumption.

The methods of design for minimizing the power consumption of digital CMOS circuits, the most effective method is to scale down supply voltage. The reason for this is that in most digital systems, power consumption is proportional to the square of supply voltage. However, since the operating speed of a digital CMOS circuit is closely related to the intensity of current, the method of lowering supply voltage may significantly decrease the operating speed of a system. Bootstrapping technology, which was proposed as a method for solving the above problem, is used to generate a voltage higher than a supply voltage by using capacitive coupling. This technology is effective in minimizing the problem of low performance although the supply voltage is lowered in order to reduce power consumption.

FIG. 1 is a diagram showing the construction of a conventional Bootstrapped Dynamic Logic (referred to as a 'BDL') for outputting one signal using bootstrapping technology. FIG. 2 is a diagram showing the construction of a conventional complementary signal output apparatus for outputting complementary signals using bootstrapping technology.

As shown in FIG. 1, the BDL using bootstrapping technology includes a bootstrapping circuit in a precharge node (which is a timing-critical path), so that the latency of the bootstrapping circuit is included in the net latency of a logic family. Accordingly, in the conventional BDL, parasitic capacitance is increased in a timing critical net because the size of an inverter must be large in order to drive a very large bootstrapping capacitor. Accordingly, a high switching speed cannot be expected. Furthermore, since the conventional BDL has a single-ended structure, as shown in FIG. 1, the construction of an XOR logic or a multiplexer logic requiring complementary inputs is restricted.

Accordingly, in order to input complementary signals to the XOR logic or multiplexer logic, a conventional differential-type logic circuit is constructed simply by connecting two BDLs 21 and 22, such as that shown in FIG. 1, to a precharged differential logic block 10, as shown in FIG. 2. However, since the conventional complementary signal output apparatus shown in FIG. 2 is configured simply by combining the two BDLs, such as that shown in FIG. 1, and is configured to output complementary signals, the entire area of the circuit is increased, so that it is difficult to use it for portable electronic devices.

SUMMARY OF THE INVENTION

Accordingly, the present invention has been made keeping in mind the above problems occurring in the prior art, and an object of the present invention is to provide an apparatus for outputting complementary signals, which can improve switching performance by improving the structures of a bootstrapping circuit block and the apparatus for outputting complementary signals and which can output complementary signals using a single bootstrapping circuit block.

In order to achieve the above object, in an apparatus for outputting complementary signals according to the present invention, a bootstrapping circuit block is separated from precharge nodes (that is, timing critical paths), and a precharged differential logic block for generating differential signals is connected in parallel to the bootstrapping circuit block. The apparatus includes a precharged differential logic block for generating a differential signal depending on an input signal, one or more output nodes for outputting the complementary signals depending on the differential signal, and a bootstrapping circuit block shared by the one or more output nodes and configured to amplify the complementary signals.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

An embodiment of the present invention will be described in detail with reference to the accompanying drawings.

Figure 3:
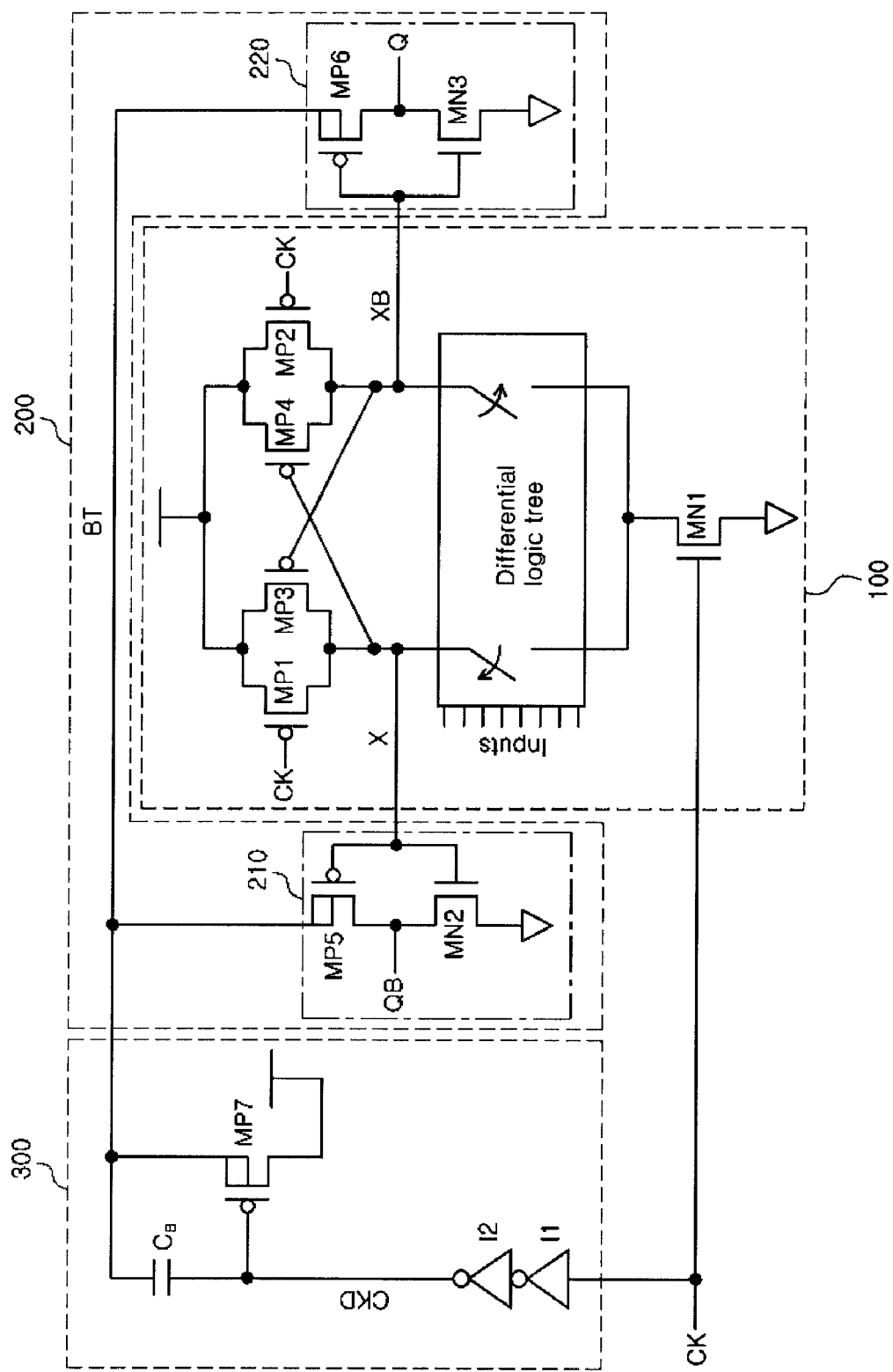
FIG. 3 is a diagram showing the construction of an apparatus for outputting complementary signals according to an embodiment of the present invention.

FIG. 3 is a diagram showing the construction of an apparatus for outputting complementary signals according to the embodiment of the present invention.

The complementary signal output apparatus includes a precharged differential logic block 100, a complementary output block 200, and a bootstrapping circuit block 300.

The precharged differential logic block 100 includes a differential logic tree and a plurality of switching means. In the embodiment of the present invention, the plurality of switching means is defined to include precharge transistors MP1 and MP2, keeper transistors MP3 and MP4, and a bottom transistor MN1. The switching means is not limited to transistors such as the above, but may be replaced with other elements depending on the level of those skilled in the art.

The differential logic tree performs a logic function, and is enabled or disabled when the bottom transistor MN1 is turned on or off in response to an input signal CK. It is preferred that the bottom transistor be formed of a first N channel bottom transistor MN1.

Furthermore, the precharged differential logic block 100 includes a first precharge node X and a second precharge node XB in order to transmit a first logic signal and a second logic signal, generated by the differential logic tree, to the complementary output block 200. That is, the precharged differential logic block 100 is enabled or disabled in response to an input signal CK identical to the input signal CK input to the bootstrapping circuit block 300, thereby generating the two logic signals. The other elements of the precharged differential logic block 100 are the same as those of the conventional precharged differential logic block 10 shown in FIG. 2 or those of a general logic circuit for outputting complementary signals, and detailed descriptions thereof are omitted here.

The complementary output block 200 includes one or more output nodes 210 and 220. The complementary output block 200 receives the two logic signals, generated according to the logic function of the differential logic tree, through the first precharge node X and the second precharge node XB, and applies the two logic signals to the respective gates of MP5-MN2 and MP6-MN3 (that is, complementary output transistors) thereby driving respective complementary signal output nodes QB and Q to output a first complementary signal and a second complementary signal. That is, the complementary output block 200 includes the first output node 210 and the second output node 220. The first output node 210 is connected to the bootstrapping circuit block 300 and the first precharge node X of the precharged differential logic block 100, and is configured to output the first of the two complementary signals. The second output node 220 is connected to the bootstrapping circuit block 300 and the second precharge node XB of the precharged differential logic block 100, and is configured to output the second of the two complementary signals. In the present invention, the complementary signals refer to a logic high signal and a logic low signal that are output at the same time. When one of the first precharge node X and second precharge node XB of the complementary output block 200 outputs a logic high signal, the other of the first precharge node X and second precharge node XB outputs a logic low signal. Here, the logic high signal and the logic low signal are output at the same time. That is, the term 'complementary signals' is used to collectively call the logic high and low signals. Hereinafter, the logic high signal and the logic low signal, which constitute the complementary signals, are respectively called a first complementary signal and a second complementary signal.

Figure 1:
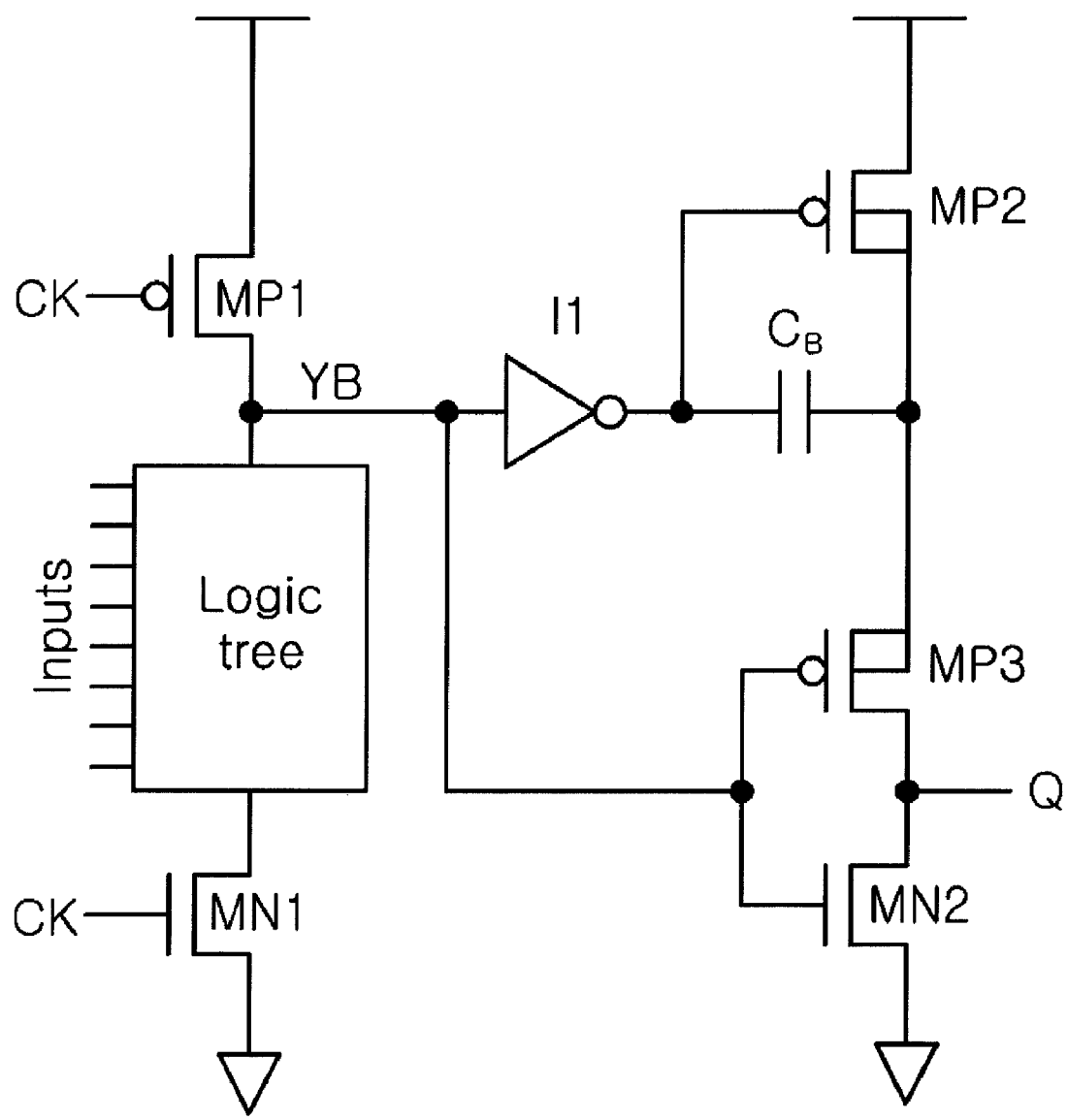
FIG. 1 is a diagram showing the construction of a conventional BDL for outputting one signal using bootstrapping technology.
Figure 2:
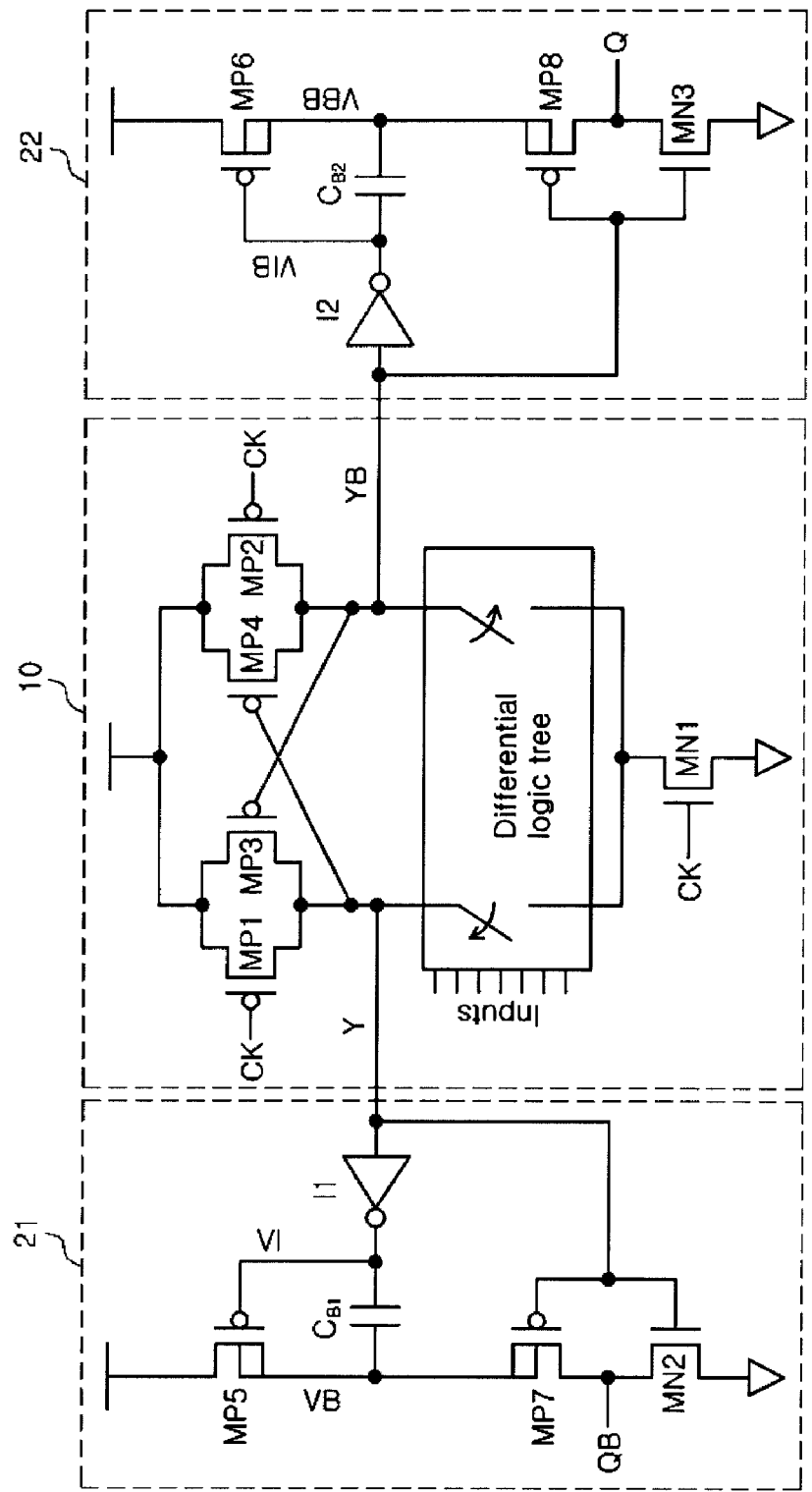
FIG. 2 is a diagram showing the construction of a conventional complementary signal output apparatus for outputting complementary signals using bootstrapping technology.

Meanwhile, the construction of the complementary output transistors MP5-MN2 and MP6-MN3, which respectively constitute the first output node 210 and the second output node 220, is the same as that of the conventional bootstrapping circuit shown in FIGS. 1 and 2. The gates of the fifth P channel complementary output transistor MP5 and second N channel complementary output transistor MN2 of the first output node 210 are connected in common to the first precharge node X of the precharged differential logic block 100. The first complementary signal output node QB is drawn from a line which connects the two complementary output transistors MN2 and MP5. The fifth P channel complementary output transistor MP5 is connected to the output terminal BT of the bootstrapping circuit block 300.

Furthermore, the gates of the sixth P channel complementary output transistor MP6 and third N channel complementary output transistor MN3 of the second output node 220 are connected in common to the second precharge node XB of the precharged differential logic block 100. The second complementary signal output node Q is drawn from a line which connects the two complementary output transistors MP6 and MN3. The sixth P channel complementary output transistor MP6 is connected to the output terminal BT of the bootstrapping circuit block 300. That is, according to the present invention, the first output node 210 and the second output node 220 are connected in common to the single bootstrapping circuit block 200.

The bootstrapping circuit block includes two inverters I1 and I2, a seventh P channel transistor MP7, and a bootstrap capacitor $C_B$. The bootstrap capacitor $C_B$ boosts the voltage of the output terminal BT of the bootstrapping circuit block 300 above the supply voltage through capacitive coupling. That is, the bootstrapping circuit block 300, as shown in FIG. 3, includes the two inverters I1 and I2 configured to receive, delay and output the input signal CK, the seventh P channel transistors MP7 configured to receive the output signal of the inverters I1 and I2, and the bootstrap capacitor $C_B$ connected in parallel to the seventh P channel transistor MP7. Here, the output terminal BT of the bootstrapping circuit block 300 to which the seventh P channel transistor MP7 and the bootstrap capacitor $C_B$ are connected, as described above, is connected to the first output node 210 and second output node 220 of the complementary output block 200. That is, the first inverter I1 is connected to the input terminal of the input signal CK, and a clock signal CKD delayed by the second inverter I2 is input to the gate of the seventh P channel transistors MP7 and the bootstrap capacitor $C_B$.

Furthermore, the output terminal BT of the bootstrapping circuit block 300 is connected to the source of the fifth P channel complementary output transistor MP5 of the first output node 210 of the complementary output block 200 and to the source of the sixth P channel complementary output transistor MP6 of the second output node 220 of the complementary output block 200.

Meanwhile, although the above-described transistors used in the present invention may be configured in various ways, they may be formed preferably of Field Effect Transistors (FET), and more preferably of Metal Oxide Semiconductor FETs (MOSFETs).

The operation of the apparatus for outputting complementary signals according to the present invention is described below.

First, when the input signal CK is a logic low signal, the first N channel bottom transistor MN1 is turned off, and the differential logic tree is disabled and the first and second precharge nodes X and XB are precharged to supply voltage. Accordingly, the complementary signal output nodes Q and QB have logic low values. In this case, the seventh P channel transistor MP7 is turned on in response to the logic low value of the clock signal CKD of the bootstrapping circuit block 300, so that the output terminal BT of the bootstrapping circuit block 300 has the value of the supply voltage.

Next, when the input signal CK is a logic high signal, one of the precharge nodes X and XB becomes a low level depending on the input value of the differential logic tree, thereby turning on the fifth P channel complementary output transistor MP5 or the sixth P channel complementary output transistor MP6. In this case, the clock signal CKD of the bootstrapping circuit block 300 has a logic high signal, so that the seventh P channel transistor MP7 is turned off and the output terminal BT has a voltage value higher than the supply voltage through capacitive coupling. The high voltage value improves the switching speed of the fifth P channel complementary output transistor MP5 and the sixth P channel complementary output transistor MP6 (that is, the output transistors). The complementary signal output node Q or QB having high voltage increases the transistor strength of the differential logic tree at the next stage, thereby improving the switching speed. That is, according to the present invention, the precharged differential logic block 100 and the bootstrapping circuit block 300 operate as a parallel structure. Accordingly, the optimal switching performance can be achieved by conforming the latency of the bootstrapping circuit block to that (latency) of the precharged differential logic block.

As described above, according to the present invention, complementary signals are output using a single bootstrapping circuit block, so that the present invention can be used for portable electronic devices configured to operate at low voltage and to require complementary signals.

Furthermore, according to the present invention, the total size of a circuit can be reduced because the single bootstrapping circuit is used, with the result that the present invention can be used for portable electronic devices having small sizes.

Furthermore, according to the present invention, the bootstrapping circuit block has a construction separated from the precharge nodes, so that there is no capacitive burden and switching performance can be improved.

Moreover, according to the present invention, a differential type circuit can be constructed, and the entire area can be reduced because complementary outputs are obtained through the sharing of the single bootstrapping circuit.

That is, the present invention can have high performance in low power applications. Accordingly, the present invention can be applied to portable electronic devices having limited power, such as mobile phones, PDAs and notebook computers.

The present invention is provided to meet the consistent need for efficient use of power in portable electronic devices, such as mobile phones, PDAs and notebook computers, so that the longest operating time can be achieved using limited battery power and high performance can be achieved using low power.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for outputting complementary signals, comprising:
   a differential logic block for performing a logic function in response to an input signal and outputting logic signals;
   a complementary output block comprising: a first output device and a second output device, each of which amplifies the logic signals from the differential logic block to provide the complementary signals; and
   a bootstrapping circuit connected in common to the first output device and the second output device and configured to apply a voltage higher than an input voltage to the complementary output block depending on the input signal, wherein the bootstrapping circuit block comprises:
   a first inverter and a second inverter for receiving the input signal, inverting the received input signal, and outputting a delayed input signal;
   a seventh transistor for receiving the delayed input signal of the first inverter and the second inverter; and
   a bootstrap capacitor connected to the seventh transistor.

2. The apparatus as set forth in claim 1, wherein:
   the differential logic block comprises a differential logic tree for performing the logic function, and
   the differential logic tree is enabled or disabled by a bottom transistor turned on or off in response to the input signal.

3. The apparatus as set forth in claim 1, wherein:
   the first output device of the complementary output block is connected to the bootstrapping circuit block and to the first precharge node of the precharged differential logic block, and is configured to output a first signal of the complementary signal in response to a first logic signal transmitted by the first precharge node, and
   the second output device of the complementary output block is connected to the bootstrapping circuit block and to the second precharge node of the precharged differential logic block, and is configured to output a second signal of the complementary signal in response to a second logic signal transmitted by the second precharge node.

4. The apparatus as set forth in claim 3, wherein:
   the first output device comprises a fifth transistor and a second transistor, gates of the fifth transistor and the second transistor being connected in common to the first precharge node, and
   the second output device comprises a sixth transistor and a third transistor, gates of the sixth transistor and the third transistor being connected in common to the second precharge node.

5. The apparatus as set forth in claim 4, wherein:
   the first output device comprises the fifth transistor and the second transistor, and
   the second output device comprises the sixth transistor and the third transistor.

6. The apparatus as set forth in claim 4, wherein the fifth transistor and the sixth transistor are connected in common to an output terminal of the bootstrapping circuit block.

7. The apparatus as set forth in claim 4, wherein an output terminal of the bootstrapping circuit block is connected in common to a source of the fifth transistor and a source of the sixth transistor.

8. The apparatus as set forth in claim 1, wherein the output of the bootstrapping circuit is provided to the first output device and to the second output device of the complementary output block.

9. The apparatus as set forth in claim 1, wherein the capacitor boosts a voltage of the output of the bootstrapping circuit block above the input voltage through capacitive coupling.

10. The apparatus as set forth in claim 1, wherein the clock signal is applied to a gate of the transistor and to the capacitor.

11. The apparatus as set forth in claim 1, wherein the bootstrapping circuit applies a voltage higher than the input voltage to the complementary output block, thereby increasing a switching speed of the complementary output block.

12. The apparatus as set forth in claim 1, wherein:
   if the first signal has a logic high state, the second signal has a logic low state, and
   if the first signal has a logic low state, the second signal has a logic high state.

* * * * *